under this patent is extended or adjusted under 35 U.S.C. 154(b) by 0 days.

(12) United States Patent
Mizutani (10) Patent No.: US 10,386,736 B2
(45) Date of Patent: Aug. 20, 2019

(54) EXPOSURE APPARATUS AND METHOD

(71) Applicant: Toshiba Memory Corporation, Minato-ku (JP)

(72) Inventor: Takuya Mizutani, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/907,482

(22) Filed: Feb. 28, 2018

(65) Prior Publication Data

US 2019/0079421 A1 Mar. 14, 2019

(30) Foreign Application Priority Data

Sep. 14, 2017 (JP) .................................. 2017-176886

(51) Int. Cl.
*G03B 27/42* (2006.01)
*G03F 9/00* (2006.01)
(Continued)

(52) U.S. Cl.
CPC .......... *G03F 9/7026* (2013.01); *G03F 7/2002* (2013.01); *G03F 7/70525* (2013.01);
(Continued)

(58) Field of Classification Search
CPC .. G03F 7/70483; G03F 7/705; G03F 7/70625; G03F 1/70; G03F 7/70125; G03F 7/70516; G03F 7/70616; G03F 1/36; G03F 7/70508; G03F 7/70091; G03F 7/70283; G03F 1/38; G03F 7/0002; G03F 7/70558; G03F 1/26; G03F 1/72; G03F 7/70075; G03F 9/7019; G03F 7/70725; G03F 7/70641; G03F 7/70775; G03F 7/7085; G03F 7/20; G03F 7/70358; G03F 7/706; G03F 9/7026; G03F 9/7034;
(Continued)

(56) References Cited

U.S. PATENT DOCUMENTS 5,412,214 A * 5/1995 Suzuki ...................... G03F 9/70
250/332
6,455,214 B1 9/2002 Wakamoto et al.
(Continued)

FOREIGN PATENT DOCUMENTS

JP  1997-306833 A  11/1907
JP  4-168718  6/1992
(Continued)

*Primary Examiner* — Mesfin T Asfaw
(74) *Attorney, Agent, or Firm* — Oblon, McClelland, Maier & Neustadt, L.L.P.

(57) ABSTRACT

According to one embodiment, an exposure apparatus performs exposure to transcribe a circuit pattern onto each of a plurality of sections on a wafer. The exposure apparatus includes a measurement device and a control device. The control device sets, on each of a first section and a second section adjacent to each other among the plurality of sections, a measurement point at a position offset from a reference position of each section. The control device causes the measurement device to measure surface information at each measurement point. The control device executes focus leveling control for exposure on the basis of the surface information measured at each measurement point.

10 Claims, 10 Drawing Sheets

(51) Int. Cl.
*H01L 21/68* (2006.01)
*H01L 21/027* (2006.01)
*G03F 7/20* (2006.01)

(52) U.S. Cl.
CPC ........ *G03F 7/70641* (2013.01); *G03F 9/7034* (2013.01); *H01L 21/0274* (2013.01); *H01L 21/681* (2013.01)

(58) Field of Classification Search
CPC .. G03F 7/70608; G03F 7/70666; G03F 7/707; G03F 7/70783; G03F 1/44; G03F 7/70; G03F 9/7069
See application file for complete search history.

(56) References Cited

U.S. PATENT DOCUMENTS

| | | |
|---|---|---|
| 7,474,381 B2 | 1/2009 | Abuku |
| 7,710,543 B2 | 5/2010 | Oishi |

FOREIGN PATENT DOCUMENTS

| | | |
|---|---|---|
| JP | 6-29286 | 2/1994 |
| JP | 10-32163 | 2/1998 |
| JP | 10-270303 | 10/1998 |
| JP | 1998-289859 A | 10/1998 |
| JP | 11-54410 | 2/1999 |
| JP | 2000-21739 | 1/2000 |
| JP | 2001-267214 | 9/2001 |
| JP | 3275368 | 4/2002 |
| JP | 2007-335611 | 12/2007 |
| JP | 2008-277468 | 11/2008 |

\* cited by examiner

EXPOSURE APPARATUS AND METHOD

CROSS-REFERENCE TO RELATED APPLICATIONS

This application is based upon and claims the benefit of priority from Japanese Patent Application No. 2017-176886, filed on Sep. 14, 2017; the entire contents of which are incorporated herein by reference.

FIELD

Embodiments described herein relate generally to an exposure apparatus and a method.

BACKGROUND

When a resist film applied on a wafer is exposed with a projection image of a circuit pattern drawn on a reticle, a topography (level difference) at a position where the projection image is formed is measured to prevent defocusing. An exposure apparatus performs focus leveling control on the basis of the measured topography.

DETAILED DESCRIPTION

According to the embodiment, an exposure apparatus performs exposure to transcribe a circuit pattern onto each of a plurality of sections on a wafer. The exposure apparatus includes a measurement device and a control device. The control device sets, on each of a first section and a second section adjacent to each other among the plurality of sections, a measurement point at a position offset from a reference position of each section. The control device causes the measurement device to measure surface information at each measurement point. The control device executes focus leveling control for exposure on the basis of the surface information measured at each measurement point.

Exemplary embodiments of an exposure apparatus and a method will be explained below in detail with reference to the accompanying drawings. The present invention is not limited to the following embodiments.

Embodiment

In recent years, miniaturization has been faced with a limit thereof in the technical field of fabrication of NAND flash memory having a two-dimensional structure. Hence, there is a concept that a capacity of a nonvolatile memory device is increased not by miniaturization but by stacking. Here, in terms of a nonvolatile memory device having a vertical NAND structure where NAND strings are arranged vertically, the number of steps of forming insulation films and wiring layers is dramatically increased for integration by stacking as compared to the two-dimensional NAND structure. Level differences on the wafer surface tend to be increased with increasing the number of steps. The level differences on the wafer surface may bring about defocusing in a lithography step. Hence, it is important to measure level differences, that is, topographies of the wafer surface with high accuracy when exposure. In the embodiment, a description is given of an exposure apparatus that can measure topographies easily and with high accuracy.

Figure 1:
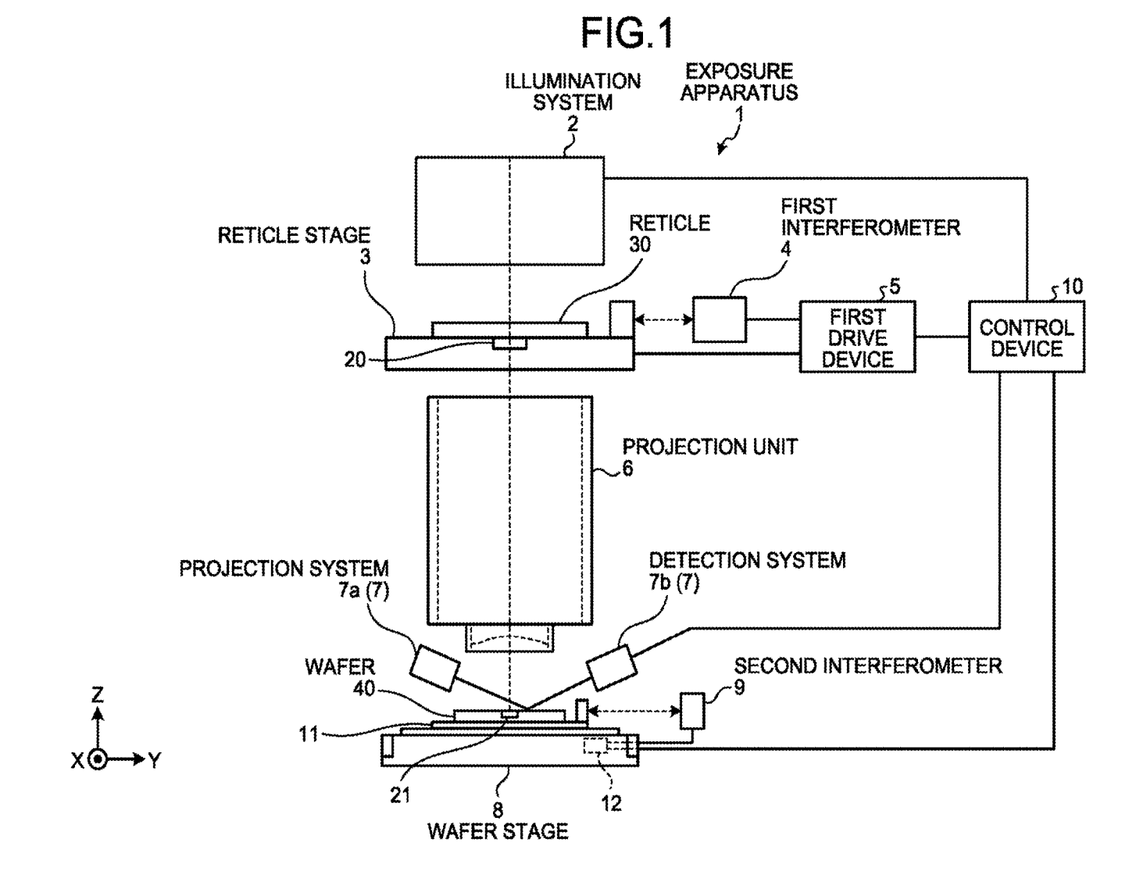
FIG. 1 is a schematic diagram illustrating an example of the configuration of an exposure apparatus of an embodiment.

FIG. 1 is a schematic diagram illustrating an example of the configuration of the exposure apparatus of the embodiment. The direction to the front side with respect to a normal to the paper surface is expressed as the X-axis direction, the direction to the right with respect to the paper surface as the Y-axis direction, and the upward direction with respect to the paper surface as the Z-axis direction. The upward direction with respect to the paper surface corresponds to the upward direction in the height direction of an exposure apparatus 1. The X-axis, the Y-axis, and the Z-axis are orthogonal to each other. The exposure apparatus 1 described here is an apparatus that has employed a step-and-scan system. However, the embodiment can also be applied to an exposure apparatus that has employed another system.

The exposure apparatus 1 includes an illumination system 2, a reticle stage 3, a first interferometer 4, a first drive device 5, a projection unit 6, a focus sensor 7, a wafer stage 8, a second interferometer 9, and a control device 10.

The reticle stage 3 supports a reticle 30 provided with a circuit pattern. The first drive device 5 includes, for example, a motor. The first drive device 5 can move the reticle stage 3 along at least an X-Y plane. The reticle stage 3 is moved to move the reticle 30. The position of the reticle stage 3 is measured by the first interferometer 4. The measurement result by the first interferometer 4 is inputted into the first drive device 5. The first drive device 5 executes position control on the reticle stage 3 on the basis of the result of the measurement by the first interferometer 4.

The wafer stage 8 supports a wafer 40 in a movable manner. Specifically, the wafer stage 8 includes a wafer chuck 11 on which the wafer 40 is mounted, and a second drive device 12 that moves the wafer chuck 11. The second drive device 12 includes, for example, a motor. The second drive device 12 can move the wafer chuck 11 in the X-, Y-, and Z-axis directions. Moreover, the second drive device 12 can control the inclination of the wafer chuck 11. The inclination is, for example, inclination (Ry) in the X direction with the Y-axis as the axis of rotation, and inclination (Rx) in the Y direction with the X-axis as the axis of rotation. The position of the wafer chuck 11 is measured by the second interferometer 9. The measurement result by the second interferometer 9 is inputted into the second drive device 12. The second drive device 12 executes position control on the wafer chuck 11 by using the result of the measurement by the second interferometer 9. The wafer chuck 11 is moved to move the wafer 40 mounted on the wafer chuck 11.

The illumination system 2 applies exposure light to an area of a region 20 on the reticle 30. The projection unit 6 projects the exposure light which has passed through the reticle 30 onto an area of a region 21 on the surface of the wafer 40. Consequently, the circuit pattern drawn on the reticle 30 is transcribed onto the wafer 40. The projection unit 6 can also be called a projection optical system. The region 21 can also be called an exposure slit.

A resist film is formed on the surface of the wafer 40. Hence, specifically, the exposure light is applied to the resist film. A projection image of the circuit pattern is formed on the surface of the resist film. The surface of the wafer 40 indicates the surface of the resist film formed on the wafer 40 below unless otherwise specified.

The focus sensor 7 is a device that measures topographies of the surface of the wafer 40. The focus sensor 7 includes a projection system 7a and a detection system 7b. The projection system 7a applies a luminous flux to the wafer 40. The wavelength and the application angle of the luminous flux are set in such a manner that the luminous flux is reflected from the surface of the wafer 40. The detection system 7b detects the reflected luminous flux and acquires the topographies of the surface of the wafer 40 on the basis of the detected luminous flux.

Figure 2:
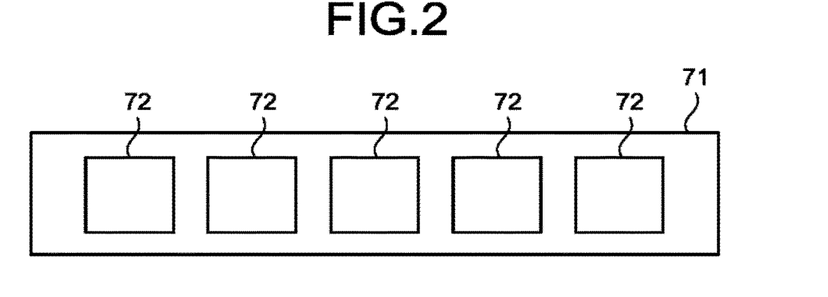
FIG. 2 is a diagram illustrating an example of a grating of the embodiment.

The projection system 7a and the detection system 7b are each provided therein with a grating 71. FIG. 2 is a diagram illustrating an example of the grating 71. The grating 71 is provided with five openings 72 according to the example of FIG. 2. The five openings 72 are spaced evenly in one direction. Here, as an example, each opening 72 has a rectangular shape. Luminous fluxes applied through the different openings 72 belonging to the grating 71 of the projection system 7a are applied to different positions on the surface of the wafer 40, and then reflected therefrom. The detection system 7h receives the luminous fluxes reflected at the positions through the different openings 72 belonging to the grating 71 of the detection system 7b, and acquires measurement data of topographies for each of the individual openings 72. In other words, the focus sensor 7 can acquire measurement data of topographies from the five measurement points in one process.

Figure 3:
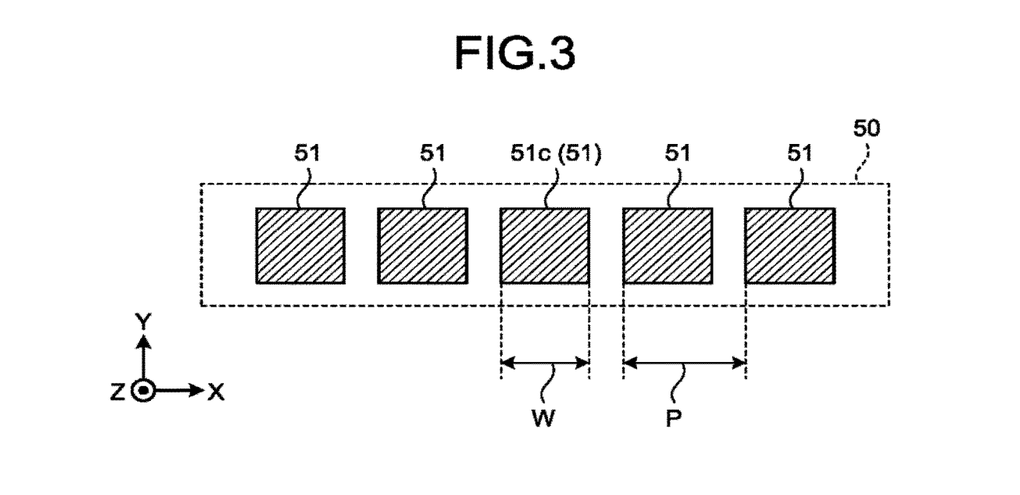
FIG. 3 is a schematic diagram for explaining a method for moving a reticle stage and a wafer chuck for exposure in the embodiment.

FIG. 3 is a diagram illustrating an example of spots of luminous fluxes applied by the projection system 7a to the surface of the wafer 40. Luminous fluxes emitted from the projection system 7a form five spots 51 on the surface of the wafer 40. The position and the attitude of the projection system 7a are set in such a manner as to arrange the five spots 51 in the X-axis direction. The width of each spot 51 in the X-axis direction is expressed as W, and the pitch of the five spots 51 as P. Moreover, among the five spots 51, the spot 51 corresponding to the center of the focus sensor 7 may be expressed as the spot 51c. Moreover, the five spots 51 may be collectively referred to as the measurement area 50.

Figure 4:
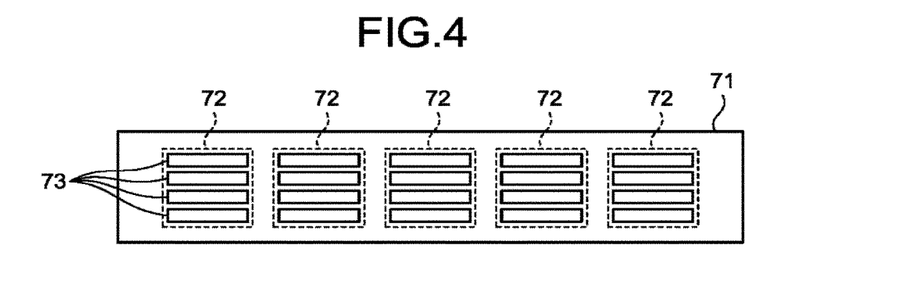
FIG. 4 is a diagram illustrating another example of the grating of the embodiment.

The focus sensor 7 may be configured in such a manner as to be able to acquire surface information from measurement points, the number of which is other than five, in one process by causing each grating 71 to include one to four, or more than five openings 72. Moreover, the opening 72 is not necessarily rectangular in shape. For example, each opening 72 may be divided into a plurality of (here four) segments 73 as illustrated by example in FIG. 4.

The control device 10 controls the illumination system 2, the focus sensor 7, the first drive device 5, and the second drive device 12.

For example, the control device 10 controls the first drive device 5 and the second drive device 12 to move the reticle stage 3 and the wafer chuck 11 for exposure.

Figure 5:
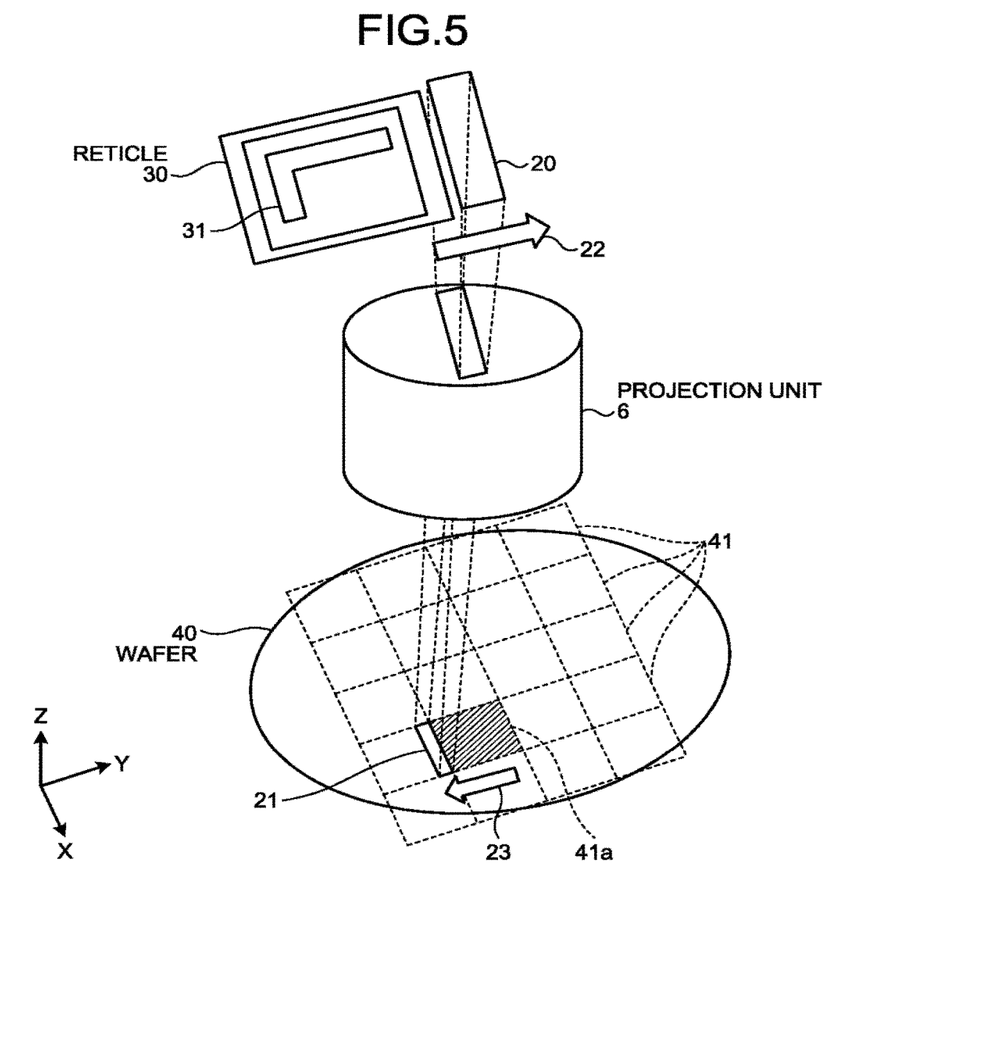
FIG. 5 is a diagram illustrating an example of luminous flux spots applied by a projection system to a surface of a wafer in the embodiment.

FIG. 5 is a schematic diagram for explaining an example of a method for moving the reticle stage 3 and the wafer chuck 11 for exposure. FIG. 5 illustrates a state before exposure of a hatched section 41a. As illustrated in FIG. 5, the wafer 40 is divided into a plurality of sections 41. The circuit pattern formed on the reticle 30 is transcribed onto each section 41 in one exposure. Each section 41 can be called a shot area. The control device 10 drives the reticle stage 3 and the wafer chuck 11 in synchronisation to move the reticle 30 relatively to the region 20 in a direction indicated by an arrow 22 (the positive direction of the Y axis) and move the wafer 40 relatively to the region 21 in a direction indicated by an arrow 23 (the negative direction of the Y axis). Consequently, a circuit pattern 31 drawn on the reticle 30 is transcribed onto the section 41 where the region 21 has been scanned. The control device 10 repeatedly makes an exposure on each section 41, and transcribes the circuit pattern 31 onto each of the plurality of sections 41.

The control device 10 performs the measurement topography by using the focus sensor 7 before the exposure. The exposure apparatus 1 moves the wafer chuck 11 to move a measurement area on the wafer 40 relatively to the wafer 40.

Figure 6:
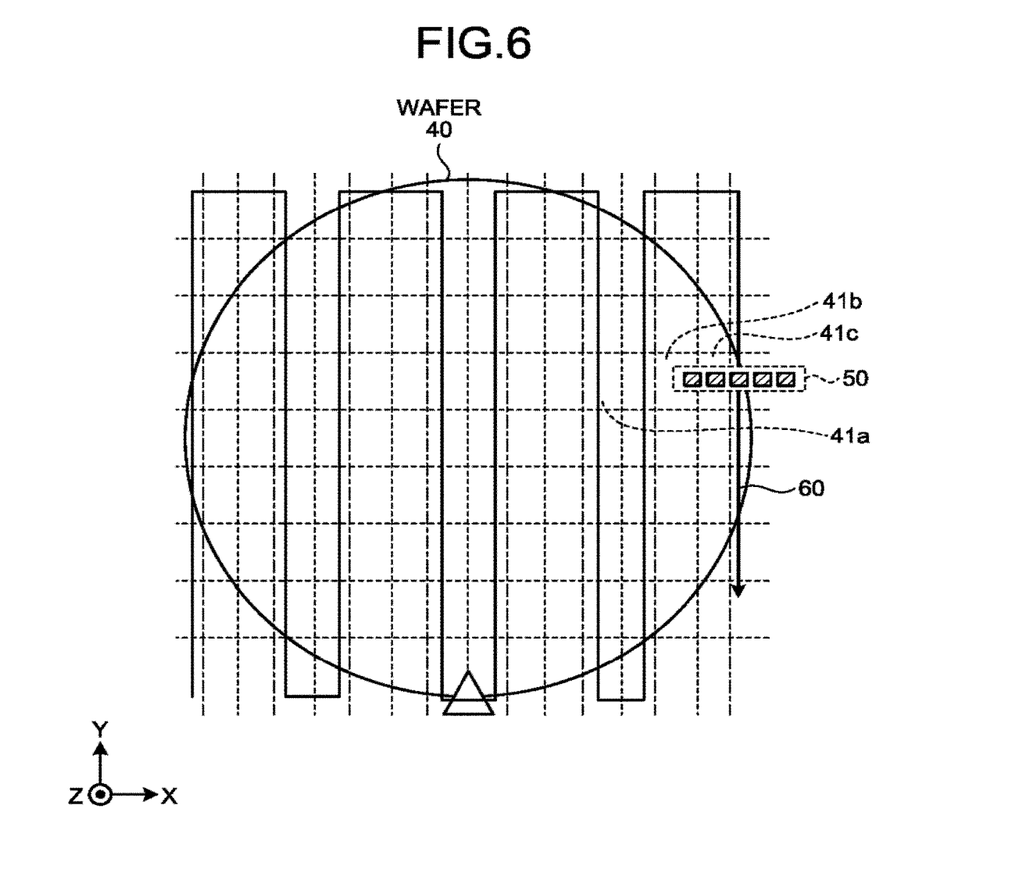
FIG. 6 is a diagram for explaining a method for moving a measurement area for measurement of topographies in the embodiment.
Figure 7:
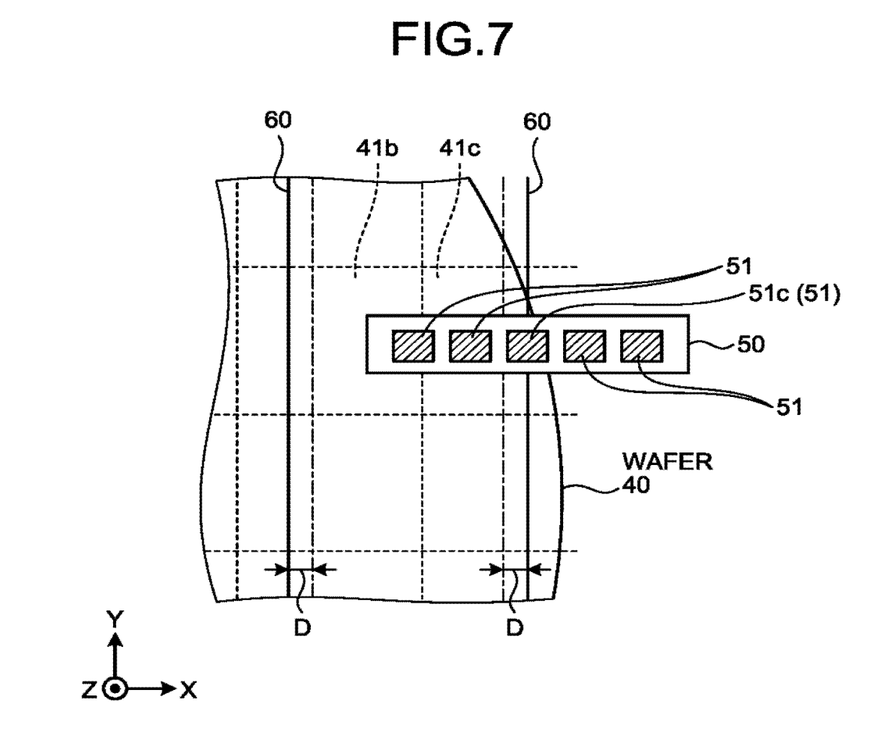
FIG. 7 is an enlarged view of a part of FIG. 6.

FIG. 6 is a diagram for explaining an example of a method for moving a measurement area for measurement of topographies. FIG. 7 is an enlarged view of a part of FIG. 6. In FIGS. 6 and 7, dotted lines indicate boundaries of the sections 41, and dot-and-dash lines indicate center lines of the sections 41 in the X-axis direction.

The sections 41 located inside the edge of the wafer 40 (for example, a section 41b) have a rectangular shape. In contrast, the sections 41 including the outer peripheral end of the wafer 40 (for example, a section 41c) have shapes whose part is missing. In terms of the sections 41 including the outer peripheral end of the wafer 40, center lines are drawn assuming that they have the rectangular shape. The sections 41 of the rectangular shape located inside the edge of the wafer 40 may be expressed as perfect sections 41. The sections 41 including the outer peripheral end of the wafer 40, the sections 41 having the shapes whose part is missing, may be expressed as defect sections 41. A forbidden zone with a constant width may be set along with the edge of the wafer 40. If the forbidden zone is included in a certain section 41, the area of the forbidden zone within the section 41 is treated as a missing part.

A path 60 is set in such a manner that the measurement area 50 crosses each section 41 in a direction (the positive or negative direction of the Y axis) different from an arrangement direction (the X-axis direction) of the spots 51. The control device 10 performs a measurement at intervals of a predetermined time, or in each scan of a predetermined amount while scanning the measurement area 50 in such a manner that the spot 51c moves along the path 60. Consequently, the control device 10 can set measurement points at five different positions in the X-axis direction at one measurement timing, and also can set measurement points at a plurality of different positions in the Y-axis direction at different timings respectively for the spots 51.

Here, in the embodiment, the path 60 is set in such a manner as to pass a position offset by a distance D in the positive or negative direction of the X axis from the center line of each section 41. In two sections 41 that are adjacent to each other in the X-axis direction, the path 60 is offset in different directions from reference positions being the center lines of the two sections 41. For example, among columns of the sections 41 arranged in the Y-axis direction, the path 60 is set at a position offset by the distance D in the negative direction of the X axis for a column including the section 41b, and is set at a position offset by the distance D in the positive direction of the X axis for a column including the section 41c.

Furthermore, in the embodiment, the control device 10 uses, as data representing a topography of one section 41, not only measurement data at each measurement point set on the one section 41 but also measurement data at each measurement point set on a section 41 adjacent to the one section 41. More specifically, the control device 10 interpolates the measurement data in one section 41 with measurement data of another section 41 adjacent to the one section 41.

Figure 8:
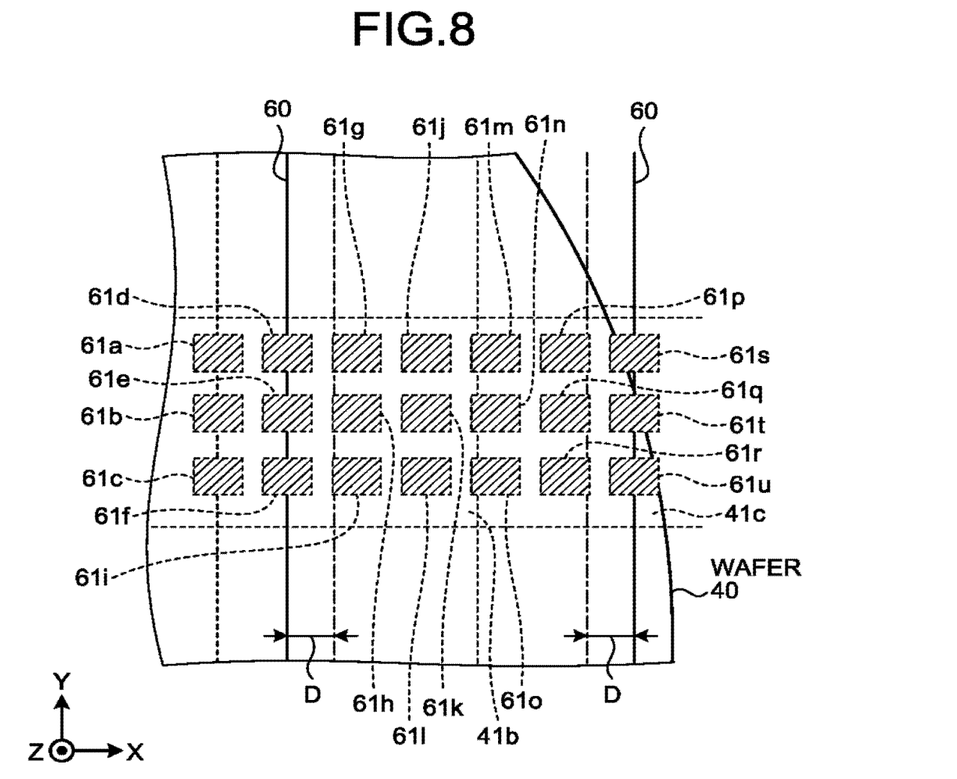
FIG. 8 is a diagram for explaining an interpolation process of the embodiment.
Figure 9:
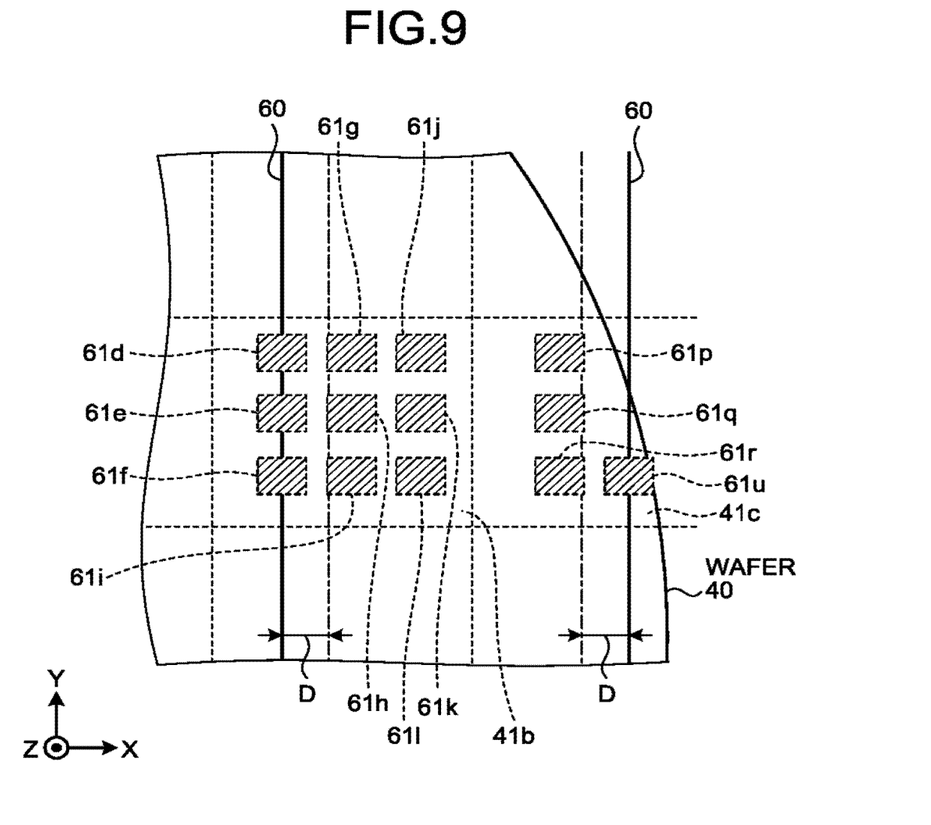
FIG. 9 is a diagram for explaining the interpolation process of the embodiment.
Figure 10:
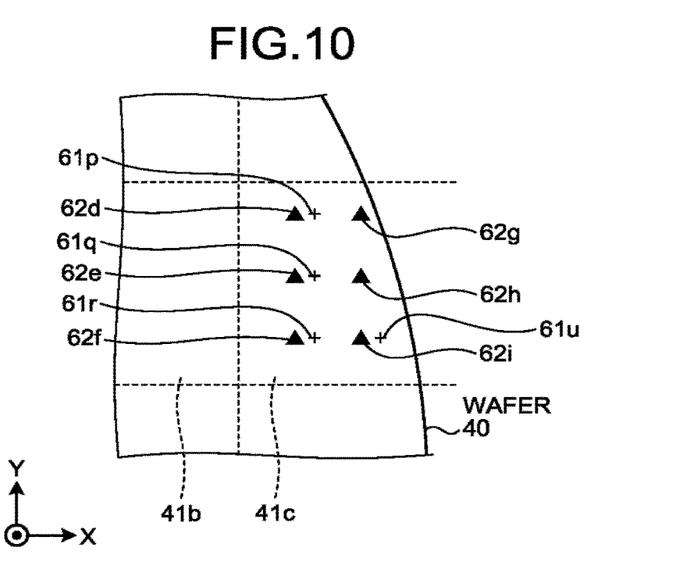
FIG. 10 is a diagram for explaining the interpolation process of the embodiment.

An example of an interpolation process of an embodiment is described with reference to FIGS. 8 to 10. In FIGS. 8 to 10, a description is given of an example where measurement data at each measurement point set on the section 41c is interpolated with measurement data at each measurement point set on the section 41b.

As illustrated in FIG. 8, measurement data at measurement points 61a to 61l is obtained from the section 41b by the measurement of a topography. Moreover, measurement data at measurement points 61m to 61u is obtained from the section 41c.

The spot 51c passes the measurement points 61d to 6f among the measurement points 61a to 61l. Hence, the group of the measurement points 61a to 61l is offset by the distance D in the negative direction of the X axis from a reference position being the center line of the section 41b. Moreover, the spot 51c passes the measurement points 61s to 61u among the measurement points 61m to 61u. Hence, the group of the measurement points 61m to 61u is offset by the distance D in the positive direction of the X axis from a reference position being the center line of the section 41c.

The control device 10 excludes measurement data that is not suitable for use from the measurement data obtained at these measurement points 61. For example, the control device 10 does not use measurement data at a measurement point 61 located on the boundary of the section 41. Moreover, the control device 10 does not use measurement data at measurement point 61 that is partly included in a missing part of the defect section 41. FIG. 9 shows measurement points 61 except for the points 61 from which measurement data to be excluded is obtained.

In FIG. 10, relative positions f positions 62d to 62i with reference to the center line of the section 41c correspond to relative positions of the measurement points 61d to 61i with reference to the center line of the section 41b. The control device 10 varies the offset direction of the path 60 between the column of the section 41b and the column of the section 41c to prevent the positions 62d to 62i from coinciding with the measurement points 61 in the section 41c. The control device 10 uses measurement data at the measurement points 61d to 61i in the section 41b, as data measured at the positions 62d to 62i. In other words, the control device 10 interpolates measurement data at the measurement points 61p to 61r and 61u with the measurement data at the measurement points 61d to 61l in the section 41b.

The control device 10 executes focus leveling control for exposure on the basis of the interpolated topography. The focus leveling control is to obtain focusing at an exposure position as accurately as possible by, for example, moving the wafer chuck 11 in the Z-axis direction and controlling the inclination of the wafer chuck 11. In the embodiment, the amount of effective measurement data presenting a topography of each section 41 is increased by interpolation. Accordingly, for example, even if the defect section 41 (such as the section 41c) having a small number of measurement points is exposed, it is possible to prevent a focus error (defocusing) due to a lack of measurement data. Moreover, also in terms of the perfect section 41, the data mount of measurement data is increased. Accordingly, the focus leveling control can be executed with higher accuracy than in the case where interpolation is not performed.

Figure 11:
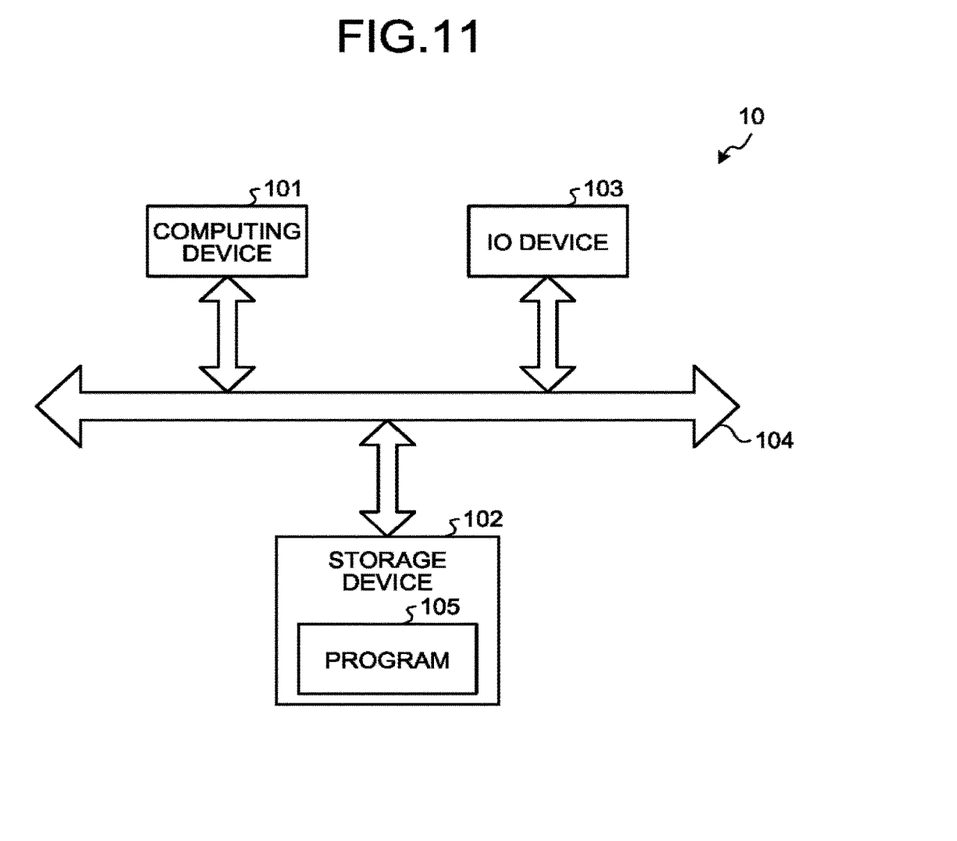
FIG. 11 is a diagram illustrating an example of a hardware configuration of a control device of the embodiment.

FIG. 11 is a diagram illustrating an example of the hardware configuration of the control device 10. As illustrated in FIG. 11, the control device 10 includes a processing device 101, a storage device 102, an IO device 103, and a bus 104. The processing device 101, the storage device 102, and the 10 device 103 are electrically connected to the bus 104, and can exchange information via the bus 104.

The processing device 101 is, for example, a CPU (Central Processing Unit). The processing device 101 achieves a function as the control device 10 on the basis of a program 105 stored in advance in the storage device 102.

The IO device 103 is an interface device for communicating with other devices (the illumination system 2 the focus sensor 7, the first drive device 5, and the second drive device 12). The processing device 101 can transmit control signals to the other devices via the 10 device 103, and receive data from the other devices (for example, measurement data from the focus sensor 7).

The storage device 102 is a memory that can hold various pieces of information. The kind of memory configuring the storage device 102 is not limited to a specific kind. For example, the storage device 102 is configured of a combination of a nonvolatile memory and a volatile memory. For example, a ROM (Read Only Memory), an HDD (Hard Disk Drive), a flash memory, a magneto-optical disk, or a combination thereof can be employed as the nonvolatile memory. Various RAMs (Random Access Memories) can be employed as the volatile memory.

The program 105 is stored in advance in, for example, the nonvolatile memory, and is loaded into the volatile memory from the nonvolatile memory at startup of the control device 10. The processing device 101 executes the program 105 loaded in the volatile memory. Intermediate data and the like during the execution of the program 105 can be stored in the volatile memory.

The program 105 can be stored in advance in the nonvolatile memory, and distributed. Moreover, the program 105 can be stored in a recording medium in a computer connected to a network such as the Internet, then can be provided or distributed by being downloaded from the computer via the network.

Figure 12:
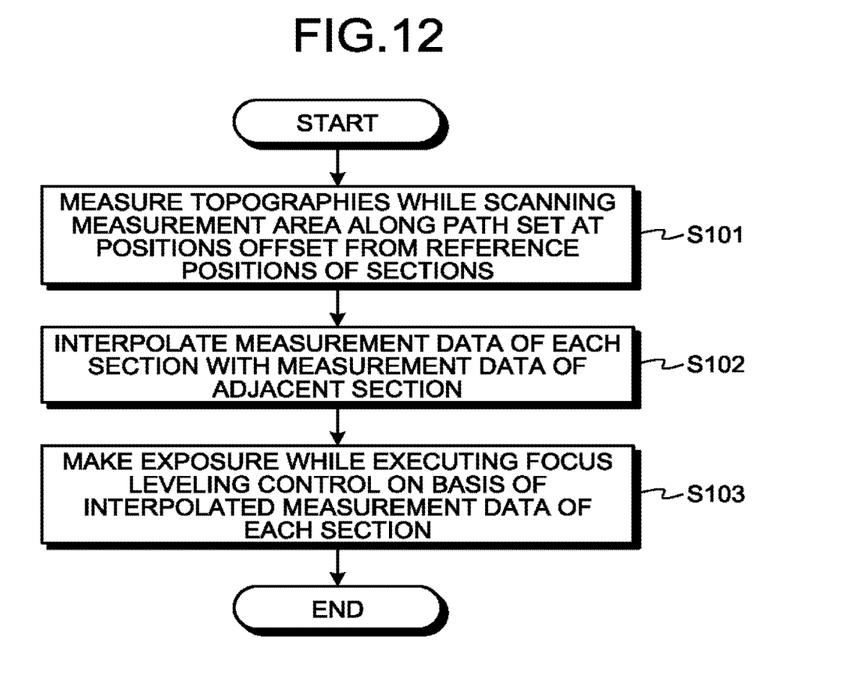
FIG. 12 is a flowchart explaining an operation of the exposure apparatus of the embodiment.

FIG. 12 is a flowchart explaining the operation of the exposure apparatus 1 of the embodiment. Firstly, the processing device 101 controls the focus sensor 7 and the second drive device 12 to measure topographies of the surface of the wafer 40 (S101). In other words, the processing device 101 acquires measurement data of a topography with the focus sensor 7 at intervals of a predetermined time, or in each scan of a predetermined distance, while scanning (causing relative movement of) the measurement area 50 along the path 60 relative to the wafer 40. The processing device 101 temporarily stores the obtained measurement data at each measurement point in, for example, the storage device 102.

Next, the processing device 101 interpolates measurement data on the basis of the obtained measurement data at each measurement point, for each section 41 (S102). As described with reference to FIGS. 8 to 10, the processing device 101 interpolates, for example, the measurement data of the section 41c with the measurement data of the section 41b.

The processing device 101 may interpolate, for example, the measurement data of the section 41b with the measurement data of the section 41 adjacent to the section 41b on a side opposite to the section 41c. As long as the section 41 whose measurement data is interpolated is adjacent to the section 41 from which measurement data used for interpolation is acquired, a method for selecting the section 41 from which measurement data used for interpolation is acquired can be freely selected.

After the interpolation of the measurement data is completed, the processing device 101 controls the illumination system 2, the first drive device 5, and the second drive device 12 to perform an exposure on each section 41 (S103). In S103, the processing device 101 performs an exposure on each section 41 to transcribe the circuit pattern onto the section 41. At this point in time, the processing device 101 executes the focus leveling control on the basis of the interpolated measurement data of each section 41.

After exposures all the sections 41 are completed, the operation is completed.

In the above description, the control device 10 measures topographies of the surface of the wafer 40 by using the focus sensor 7. The topography is an example of surface information used in the focus leveling control. Any information can be employed as the surface information as long as it is information that can be used for the focus leveling control. For example, the control device 10 may cause the focus sensor 7 to measure the position and the inclination in the z-axis direction (that is, the optical axis direction) as the surface information.

Moreover, the control device 10 excludes the measurement data of the measurement points 61 located on the boundaries of the plurality of the sections 41 as illustrated in FIG. 9. A method for determining the use/non-use of measurement data at each measurement point 61 is not limited to this.

Moreover, the control device 10 offsets a group of the measurement points 61 from a reference position being the center line of each section 41. A method for setting a reference position is not limited to this.

Moreover, the control device 10 offsets a group of the measurement points 61 in the X-axis direction. The control device 10 may offset the position of each measurement point 61 in the Y direction by putting some thought into measurement timings during scanning of the measurement area 50. For example, a group of the measurement points 61 may be offset in the positive direction of the Y axis for the column of the section 41b, and a group of the measurement points 61 may be offset in the negative direction of the Y axis for the column of the section 47c.

Moreover, the control device 10 increases the amount of effective measurement data by interpolation. The control device 10 does not necessarily perform an interpolation.

Figure 13:
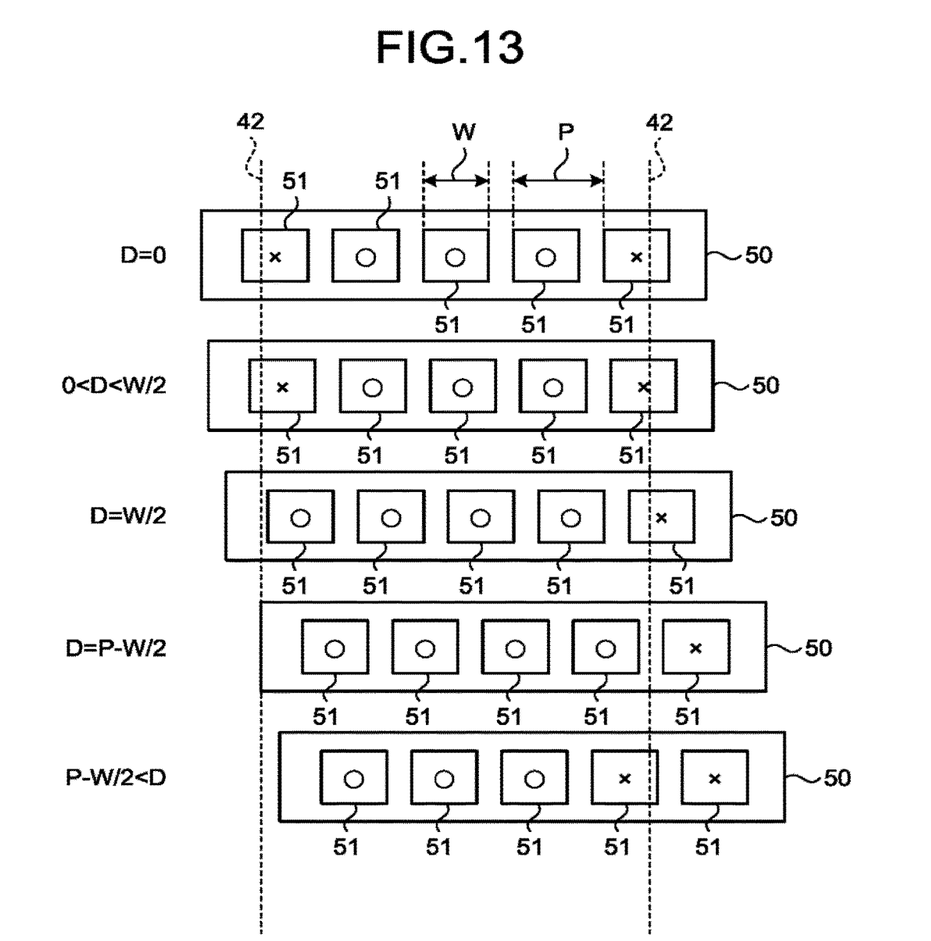
FIG. 13 is a diagram for explaining an example of a method for setting an offset amount (a distance D offset) in the embodiment.

FIG. 13 is a diagram for explaining an example of a method for setting an offset amount (the distance D offset). In FIG. 13, two dotted lines 42 indicate boundaries of one section 41 in the X-axis direction. Moreover, a cross or circle is displayed at each measurement point 61. Each cross indicates a measurement point 61 from which measurement data obtained is to be excluded. Each circle indicates a measurement point 61 from which measurement data obtained is to be used.

As illustrated in FIG. 13, when the distance D is zero, that is, when a group of the measurement points 61 is not offset, the spots 51 located at both ends among the five spots 51 included in the measurement area 50 lie off the boundaries of the section 41. Hence, measurement data measured from the spots 51 located at both ends among the five spots 51 is excluded. Also when the distance D is greater than zero and less than W/2, the amount of usable measurement data is the same as the case where the distance D is zero.

When the distance D is W/2, or when the distance D is (P−W/2), measurement data measured by using the spot 51 located at the right end among the five spots 51 included in the measurement area 50 is excluded.

When the distance D is greater than (P−W/2), measurement data measured by using two spots 51 at the right end among the five spots 51 included in the measurement area 50 is excluded.

In this manner, the distance D is set to a value equal to or greater than W/2 and equal to or less than (P−W/2), and accordingly the amount of measurement data representing a topography of each section 41 can be increased. Hence, the control device 10 may perform an offset on a group of the measurement points 61 without interpolation.

As described above, according to the embodiment, the control device 10 sets, on two sections 41 adjacent to each other, measurement points 61 at positions offset from reference positions of the two sections 41, and causes the focus sensor 7 to measure surface information at the measurement points 61. The control device 10 then executes the focus leveling control for exposure on the basis of the surface information obtained at the measurement points 61.

With this configuration, the amount of effective measurement data of each section 41 can be increased. Accordingly, it is possible to prevent defocusing due to a lack of measurement data. In other words, the convenience of the exposure apparatus 1 can be increased.

Moreover, according to the embodiment, the control device 10 makes a relative position of a measurement point 61 set on a first section 41 with reference to a reference position of the first section 41 and a relative position of a measurement point 61 set on a second section 41 with reference to a reference position of the second section 41 different from each other. The first section 41 is one section 41 of the two sections 41 adjacent to each other, and the second section 41 is the other section 41 of the two sections 41 adjacent to each other.

With this configuration, it is possible to interpolate measurement data of the one section 41 with measurement data obtained in the other section 41.

In the above description, the measurement points 61 of the two sections 41 are offset by the distance D in directions opposite to each other. In this case, a difference between a relative position of the measurement point 61 set on the one section 41 with reference to a reference position of the one section 41 and a relative position of the measurement point 61 set on the other section 41 with reference to a reference position of the other section 51 corresponds to 2*D. If the value of 2*D is, for example, less than P, measurement data obtained in the one section 41 can be interpolated with measurement data obtained in the other section 41.

The directions in which the measurement points 61 are offset are not limited to the above-mentioned directions. The measurement points 61 may be offset in the same direction in the two sections 41. In such a case, the difference between the relative positions may be set greater than zero and less than P, and accordingly the measurement data of the one section 41 can be interpolated with the measurement data obtained in the other section 41.

Moreover, according to the embodiment, the control device 10 executes the focus leveling control for exposure on the one section 41 of the two sections 41 by using measurement data obtained in the one section 41 and measurement data obtained in the other section 41. More specifically, the control device 10 regards measurement data obtained at a measurement point in the other section 41 as measurement data obtained at a measurement point located at a position offset a relative position of the one section 41 by an offset amount of the measurement point in the other section 41.

With this configuration, the amount of the measurement data in the one section 41 is increased. Accordingly, it is possible to prevent defocusing due to a lack of the measurement data.

In an inexpensive or old-type exposure apparatus, the pitch P of each spot 51 may be greater than that of the latest exposure apparatus. According to the above-mentioned configuration, the number of measurement points can be increased in a pseudo manner. Therefore, if the above-mentioned configuration is applied to the exposure apparatus where the pitch P is not fine, the accuracy of the focus leveling control can be improved.

Moreover, according to the embodiment, the control device 10 can interpolate measurement data of a defect section 41 like the section 41c with measurement data of a perfect section 41 like the section 41b. Hence, the highly accurate focus leveling control is possible also in the defect section 41 from which less measurement data is obtained than the perfect section 41.

Moreover, the control device 10 can increase the amount of measurement data representing a topography of each section 41 by using a value equal to or greater than W/2 and equal to or less than (P−W/2) as the distance D, as described with reference to FIG. 13.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An exposure apparatus that performs exposure to transcribe a circuit pattern onto each of a plurality of sections on a wafer, the exposure apparatus comprising:
   a measurement device; and
   a control device that sets, on each of a first section and a second section adjacent to each other among the plurality of sections, a measurement point at a position offset from a reference position of each section, causes the measurement device to measure surface information at each measurement point, and executes focus leveling control for exposure on the basis of the surface information measured at each measurement point, wherein
   the control device makes a first relative position and a second relative position different from each other, the first relative position being a relative position of a first measurement point with reference to a reference position of the first section, the first measurement point being a measurement point set on the first section, the second relative position being a relative position of a second measurement point with reference to a reference position of the second section, the second measurement point being a measurement point set on the second section, wherein
   the control device executes the focus leveling control for exposure of the first section on the basis of surface information measured at the first measurement point and surface information measured at the second measurement point, wherein
   the control device executes the focus leveling control for the exposure of the first section by using the surface information measured at the second measurement point as surface information measured at a position offset from the reference position of the first section by an offset amount of the second measurement point.

2. The exposure apparatus according to claim 1, wherein the first section is a section including a missing part, and the second section is a rectangular section without a missing part.

3. The exposure apparatus according to claim 1, wherein the first measurement point includes a plurality of third measurement points spaced a first value apart in a first direction,
   the second measurement point includes a plurality of fourth measurement points spaced the first value apart in the first direction, and
   a difference between an offset amount of the first measurement point and the offset amount of the second measurement point is less than the first value.

4. The exposure apparatus according to claim 1, wherein an offset amount of each measurement point is equal to or greater than a first value obtained by dividing a second value by two, and is equal to or less than a third value obtained by subtracting the first value from a fourth value,
   each measurement point includes a plurality of third measurement points spaced the fourth value apart in a direction, and
   each of the plurality of third measurement points has a width of the second value.

5. A method comprising:
   setting, on each of a first section and a second section adjacent to each other on a wafer, a measurement point at a position offset from a reference position of each section,
   measuring surface information at each measurement point, and
   transcribing, by exposure, a circuit pattern onto the first and second sections while executing focus leveling control on the basis of the surface information measured at each measurement point, wherein
   the setting further includes making a first relative position and a second relative position different from each other, the first relative position being a relative position of a first measurement point with reference to a reference position of the first section, the first measurement point being a measurement point set on the first section, the second relative position being a relative position of a second measurement point with reference to a reference position of the second section, the second measurement point being a measurement point set on the second section, the transcribing includes interpolating first surface information measured at the first measurement point with second surface information measured at the second measurement point, and the executing being executing the focus leveling control for exposure of the first section on the basis of the first surface information which is interpolated with the second surface information.

6. The method according to claim 5, wherein the interpolating including adding, to the first surface information, the second surface information as surface information measured at a position offset from the reference position of the first section by an offset amount of the second measurement point.

7. The method according to claim 6, wherein
the first section is a section including a missing part, and
the second section is a rectangular section without a missing part.

8. The method according to claim 6, wherein
the first measurement point includes a plurality of third measurement points spaced a first value apart in a first direction,
the second measurement point includes a plurality of fourth measurement points spaced the first value apart in the first direction, and
a difference between an offset amount of the first measurement point and the offset amount of the second measurement point is less than the first value.

9. The method according to claim 5, wherein
an offset amount of each measurement point is equal to or greater than a first value obtained by dividing a second value by two, and is equal to or less than a third value obtained by subtracting the first value from a fourth value,
each of the measurement points includes a plurality of third measurement points spaced the fourth value apart in a first direction, and
each of the plurality of third measurement points has a width of the second value.

10. The exposure apparatus according to claim 1, wherein
the measurement device includes a projection system and a detection system each including a grating with openings,
the openings are spaced evenly in a first direction,
each measurement point includes a plurality of third measurement points spaced evenly in a second direction,
luminous fluxes applied through the openings of the grating of the projection system are applied to the plurality of third measurement points, and
the detection system receives the luminous fluxes reflected at the plurality of third measurement points through the openings of the grating of the detection system, and acquires surface information regarding the plurality of third measurement points.

* * * * *